United States Patent
Kordina

(10) Patent No.: US 7,247,513 B2
(45) Date of Patent: Jul. 24, 2007

(54) DISSOCIATION OF SILICON CLUSTERS IN A GAS PHASE DURING CHEMICAL VAPOR DEPOSITION HOMO-EPITAXIAL GROWTH OF SILICON CARBIDE

(75) Inventor: Olof Claes Erik Kordina, Butler, PA (US)

(73) Assignee: Caracal, Inc., Ford City, PA (US)

( * ) Notice: Subject to any disclaimer, the term of this patent is extended or adjusted under 35 U.S.C. 154(b) by 0 days.

(21) Appl. No.: 10/431,819

(22) Filed: May 8, 2003

(65) Prior Publication Data
US 2004/0222501 A1 Nov. 11, 2004

(51) Int. Cl.
*H01L 21/04* (2006.01)
(52) U.S. Cl. ............ 438/105; 438/931; 257/77; 257/E21.054; 257/E21.065
(58) Field of Classification Search ............ 257/76, 257/77, 80, 632, 636, 642, 645, 651, E21.054, 257/E21.065; 438/105, 82, 725, 931
See application file for complete search history.

(56) References Cited

U.S. PATENT DOCUMENTS

| | | | | |
|---|---|---|---|---|
| 3,617,398 A | * | 11/1971 | Bilous et al. | 438/543 |
| 3,920,799 A | * | 11/1975 | Wiebke et al. | 423/341 |
| 3,925,577 A | * | 12/1975 | Fatzer et al. | 427/249.16 |
| 4,634,601 A | * | 1/1987 | Hamakawa et al. | 438/485 |
| 4,865,659 A | * | 9/1989 | Shigeta et al. | 148/33.4 |
| 5,248,385 A | * | 9/1993 | Powell | 438/507 |
| 5,254,370 A | * | 10/1993 | Nagasawa et al. | 427/249.15 |
| 5,612,132 A | * | 3/1997 | Goela et al. | 428/332 |
| 5,704,985 A | * | 1/1998 | Kordina et al. | 118/725 |
| 5,915,194 A | * | 6/1999 | Powell et al. | 438/478 |
| 6,039,812 A | | 3/2000 | Ellison et al. | |
| 6,063,186 A | | 5/2000 | Irvine et al. | 117/89 |
| 6,297,522 B1 | | 10/2001 | Kordina et al. | 257/77 |
| 6,620,518 B2 | * | 9/2003 | Lavery et al. | 428/450 |
| 6,665,476 B2 | * | 12/2003 | Braun et al. | 385/50 |
| 2002/0197761 A1 | * | 12/2002 | Patel et al. | 438/52 |

FOREIGN PATENT DOCUMENTS

| | | |
|---|---|---|
| DE | 44 32 813 | 9/1994 |
| DE | 44 32 813 * | 3/1996 |
| EP | 0 554 047 | 8/1993 |

(Continued)

OTHER PUBLICATIONS

Gao et al., "Low-temperature chemical-vapor deposition of 3C-SiC films on Si(1 0 0) using SiH4-C2H2-HCl-H2", Journal of Crystal Growth, vol. 191, p. 439-445 (1998).*

(Continued)

*Primary Examiner*—Sara Crane
*Assistant Examiner*—Andrew O Arena
(74) *Attorney, Agent, or Firm*—Schnader Harrison Segal & Lewis LLP

(57) ABSTRACT

A method of forming a layer of silicon carbide wherein silicon clusters are dissociated in a gas phase. Silicon clusters may be dissociated by a silicon-etching gas such as a group VII-containing component. A semiconductor device is also disclosed having a layer formed by the methods of the invention.

44 Claims, 1 Drawing Sheet

FOREIGN PATENT DOCUMENTS

| EP | 0835 336 B1 | | 9/2002 |
|---|---|---|---|
| WO | WO 00/43577 | * | 7/2000 |
| WO | WO00/43577 A1 | | 7/2000 |
| WO | WO 01/27361 A1 | | 4/2001 |

OTHER PUBLICATIONS

Barrett, et al., "Growth of Large SiC Single Crystals," *Journal of Crystal Growth*, vol. 128, pp. 358-362, (1993).

Ellison, et al., "Fast SiC Epitaxial Growth in a Chimney CVD Reactor and HTCVD Crystal Growth Developments," *Materials Science Forum*, vols. 338-342, pp. 131-136, (2000).

Ellison, et al., "HTCVD Growth of Semi-Insulating 4H-SicC Crystals with Low Defect Density," *Mat. Res. Soc. Symp.*, vol. 640, pp. H1.2.1-H1.2.11, (2001).

Ellison, et al., "HTCVD Grown Semi-Insulating SiC Substrates," *Materials Science Forum*, vols. 433-436, pp. 33-38, (2003).

Sundqvist, et al., "Growth of High Quality p-Type 4H-SiC Substrates by HTCVD," *Materials Science Forum*, vols. 433-436, pp. 21-24, (2003).

Tairov, et al., "Investigation of Growth Processes of Ingots of Silicon Carbide Single Crystals," *Journal of Crystal Growth*, vol. 43, pp. 209-212, (1978).

International Search Report, PCT/US04/13058, date of completion: Jun. 21, 2005, date of mailing: Jul. 7, 2005.

Chaudhry, et al., "The Role of Carrier Gases in the Epitaxial Growth of B-SiC on Si by CVD," *Journal of Crystal Growth*, 113:1/2, pp. 121-126, (Aug. 1991).

Chen, et al., "Improvement of 3C-SiC Surface Morphology on Si(100) by Adding HCI using Atmospheric CVD," *Materials Science Forum*, vols. 338-342, pp. 257-260, (2000).

Gao, et al., "Low-Temperature Chemical-Vapor Desposition of 3C-SiC Films on Si(1 0 0) Using SiH4-C2H4-HCI-H2" *Journal of Crystal Growth*, vol. 191, pp. 439-445, (1998).

Kimoto, et al., "Recent Achievements and Future Challenges in SiC Homoepitaxial Growth," *Materials Science Forum*, vols. 389-393, pp. 165-170, (2002).

Masuda, et al., "Surface Morphology of 4H-SiC Inclined Towards <1100> and ,<1120> Grown by APCVD Using The Si2C16+C3H8 System," *Materials Science Forum*, vols. 353-356, pp. 139-142, (2001).

Miyanagi, et al., "Hot-Wall CVD Growth of 4H-SiC Using Si2C16+C3H8+H2 System," *Materials Science Forum*, vols. 389-393, pp. 199-202 (2002).

Nordby, et al., "Multi-Wafer VPE Growth and Characterization of SiC Epitaxial Layers," *Materials Science Forum*, vols. 338-342, pp. 173-176, (2000).

Powell, et al., "SiC Materials—Progress, Status, and Potential Roadblocks," *Proceedings of the IEEE*, 90:6, pp. 942-955, (Jun. 2002).

Schoner, et al., "Highly Uniform Epitaxial SiC-Layers Grown in a Hot-Wall CVD Reactor with Mechanical Rotation," *Materials Science Forum*, vols. 389-393, pp. 187-190 (2002).

Tsuchida, et al., "LPCVD Growth and Structural Properties of 4H-SiC Epitaxial Layers," *Materials Science Forum*, vols. 338-342, pp. 145-148 (2000).

Vorob'ev, et al., "Influence of Silicon Gas-to-Particle Conversion on SiC CVD in a Cold-Wall Rotating-Disc Reactor," *Materials Science Forum*, vols. 353-356, pp. 107-110 (2001).

Zhang, et al., "Epitaxial Growth of 4H-SiC in a Vertical Hot-Wall CVD Reactor: Comparison Between Up- and Down-Flow Orientations," *Materials Science Forum*, vols. 353-356, pp. 91-94 (2001).

"Growth Process of Silicon Carbide," *The Materials Science SiC Hompage*, http/www.ifm.liu.se/Matephys/new-page/research/sic/Chapter3.html., pp. 1-11.

\* cited by examiner

DISSOCIATION OF SILICON CLUSTERS IN A GAS PHASE DURING CHEMICAL VAPOR DEPOSITION HOMO-EPITAXIAL GROWTH OF SILICON CARBIDE

FIELD OF THE INVENTION

The invention relates to epitaxial crystal growth, and more particularly to silicon carbide epitaxial growth.

BACKGROUND OF THE INVENTION

Epitaxial growth is typically used to form a high quality layer on a substrate. In epitaxy crystal growth, a high growth rate and a smooth surface are desirable. A high capacity of the reactor in which growth takes place is usually also desirable.

At atmospheric pressure, it is difficult to reliably form a quality layer on a large substrate. The surface morphology of a layer grown at atmospheric pressure is usually poor on account of a high degree of homogeneous nucleation. Homogeneous nucleation is the effect you obtain when one or several precursors react and grow in the gas phase to form clusters or micro-crystals of material. Silane can, for instance, decompose thermally and small micro-crystals of silicon will grow if the concentration of silane is high. A reduction in pressure and/or increase of hydrogen carrier flow improves the situation significantly, however, etching of the SiC surfaces due to the hydrogen will increase markedly.

For silicon carbide, the standard precursors are silane and a hydrocarbon together with hydrogen as a carrier gas. Unfortunately, as the reactors have become larger, the need to put in more silane has resulted in a higher degree of homogeneous nucleation, which manifests itself as poor morphology, and, in severe cases, as particles on the surface, often mistaken as particle downfall from the walls of the reactor/susceptor. Very often homogeneous nucleation can be observed with the naked eye (screened by an equal density filter for the intensity) as whisps of smoke in the reactor.

If the concentration of silane is too high (a high supersaturation) it literally "rains" silicon, forming boulders on the substrate surface, or, if the concentration is somewhat lower, the homogeneous nucleation creates a wavy effect on the surface.

These problems may be reduced by adding more hydrogen, going to lower pressure, and/or modifying the inlet of the gases. The addition of more hydrogen, especially in combination with low pressure, unfortunately increases the etch rate of the SiC which reduces the net growth rate. It will also stress the materials inside the reactor, particularly the graphite materials and may create holes in the coating thereby releasing lots of impurities. The high gas flows at low pressure will also increase the size of the pump, pump lines, and cooling of the reactor parts which cost significant amounts of money. The high gas flows also markedly cool the front of the reactor, which often results in a reduced uniformity of the layer. Addition of argon replacing some of the hydrogen can improve the uniformity, however, argon addition tends to amplify homogeneous nucleation problems, making its use impractical for large reactors.

An interesting growth technique referred to as the "chimney technique" invented by Alex Ellison uses a very low flow of hydrogen and a fairly low pressure of 200 mbar. The system is vertical with the inlet at the bottom, but due to the reduced pressure, buoyancy is not a dominant force and therefore the inlet can be from the top equally well. The principle of the technique is that the silane cracks to form silicon clusters in the inlet region. These clusters of silicon are transported via the carrier flow towards the substrate. As the temperature increases (the substrate temperature is between 1700° C.-1900° C.) the silicon clusters dissociate and become available for growth. It is important that the gas is heated enough so that the silicon clusters dissociate. In a horizontal reactor, this method does not work unless the samples are placed upside down. If they are not placed upside down, large boulders created by silicon droplets falling down will be manifested on the surface. Growth rates with this technique were in the order of 10-50 microns/h using minor amounts of silane gas. The doping was also very low, but due to the high temperature, the carrier lifetimes were poor. The morphology was very good on some places but it was unfortunately not uniform over the whole wafer surface.

Accordingly, a need exists to reduce the degree of homogeneous nucleation preferably with lower gas flows and higher pressures while maintaining adequate growth rate and crystal uniformity.

SUMMARY OF THE INVENTION

The invention includes a method of forming a layer of silicon carbide wherein silicon clusters are dissociated in a gas phase. Silicon clusters may be dissociated by a silicon-etching gas such as a group VII-containing component. Examples of dissociation enhancers are HCl, HBr, HF and a combination of two or more of the aforementioned compounds. Preferably the group VII-containing component is HCl.

The present invention also includes a semiconductor device having a layer formed by the inventive methods.

DESCRIPTION OF THE DRAWINGS

The invention is best understood from the following detailed description when read with the accompanying drawings.

DETAILED DESCRIPTION OF THE INVENTION

Figure 1:
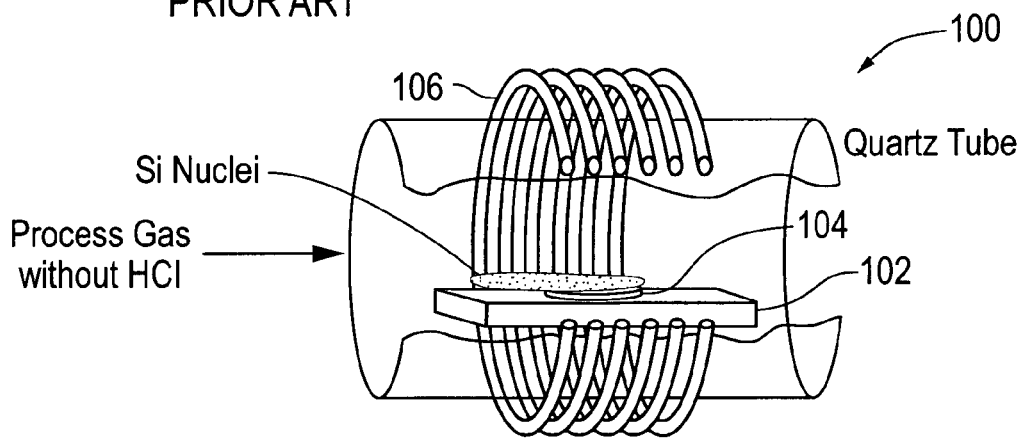
FIG. 1 depicts a prior art method of silicon carbide formation.

The current invention is an improvement to the standard SiC epitaxy as it may eliminate or greatly reduce the homogeneous nucleation. By adding a dissociation-enhancer into a precursor stream containing a silicon source, silicon clusters can be dissociated in the gas phase. The dissociation-enhancer may be, for example, a group VII-containing component, such as a chlorine-containing component. In a preferred embodiment of the invention, HCl is used as the dissociation enhancer. Other silicon-etching gases are also within the scope of the invention.

Experiments show that, not only can the morphology improve markedly with use of a dissociation enhancer, but, surprisingly, the growth rate increases too, likely because there is more silicon available for growth. The results are particularly surprising in light of critics having long held that a chlorine-containing compound such as HCl will etch everything it comes in contact with, and will reduce the growth rate.

The invention is particularly applicable to homo-epitaxial growth, but can be applied to hetero-epitaxial growth, polycrystalline and amorphous growth.

The group VII-containing component may be for example, HCl, HBr or HF. The group VII-containing component can be added together with the silicon source, preferably in approximately equal amounts. It may also be added separately from the silicon source and preferably at a distance close to where the clusters must be dissolved i.e. near the sample. The group VII-containing compound is preferably added at a distance of about 10 mm to about 300 mm from the sample. A further illustrative range is about 20 mm to 100.

The advantage of the separate flows of the group VII-containing compound and silicon source is that the silicon source can react and form silicon clusters. These clusters can be readily transported through the reactor, thereby likely reducing or eliminating silicon deposits on the reactor walls. Once dissociated, they will deposit more readily. Hence, with the split flow of the group VII-containing compound and the silicon source, a better efficiency of your input precursors may be obtained.

Instead of, or in addition to, using silane and a group VII-containing compound, the silicon and the group VII atom can be combined into one molecule. The silicon source may in this case be for example, a chlorosilane such as trichlorosilane, silicon tetrachloride, $Si_2Cl_6$, $Si_3Cl_8$ or a combination of two or more of the aforementioned compounds. These and other group VII-containing components can be used alone or in any combination with one another. Trichlorosilane and silicon tetrachloride are less prone to forming clusters in the gas phase than silane and dichlorosilane. They are commonly used in silicon epitaxy, and are therefore, readily available at low cost. To decompose these molecules, hydrogen should be present. Therefore, trichlorosilane or silicon tetrachloride can be added separately into the hot zone of the growth chamber and mixed with hydrogen and one or more types of hydrocarbons close to the sample upon which growth is to take place to improve the efficiency. Close to the sample is in the "hot" or "deposition" zone. Preferably the chlorosilane is transported in a carrier gas, such as an inert gas. Most preferably, the carrier gas is helium.

In a further embodiment of the invention, at least a portion of the chlorosilane, hydrogen and hydrocarbons are added to the growth chamber together.

FIG. 1 shows a prior art method wherein a process gas, such as containing hydrocarbons and hydrogen, is introduced into an environment containing silicon nuclei, to form a silicon carbide material. No chlorine-containing material is used in the process. The process is performed in a growth chamber 100 (shown in relevant part) having a susceptor 102 on which a sample 104 is contained. An RF coil 106 produces sufficient heat for chemical deposition to take place.

Figure 2:
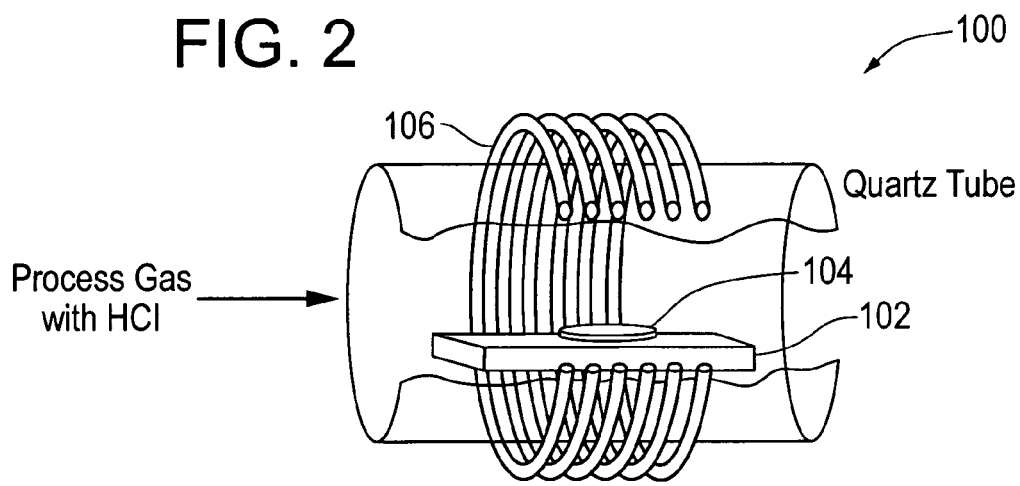
FIG. 2 depicts a chemical vapor deposition method according to an illustrative embodiment of the invention.
Figure 3:
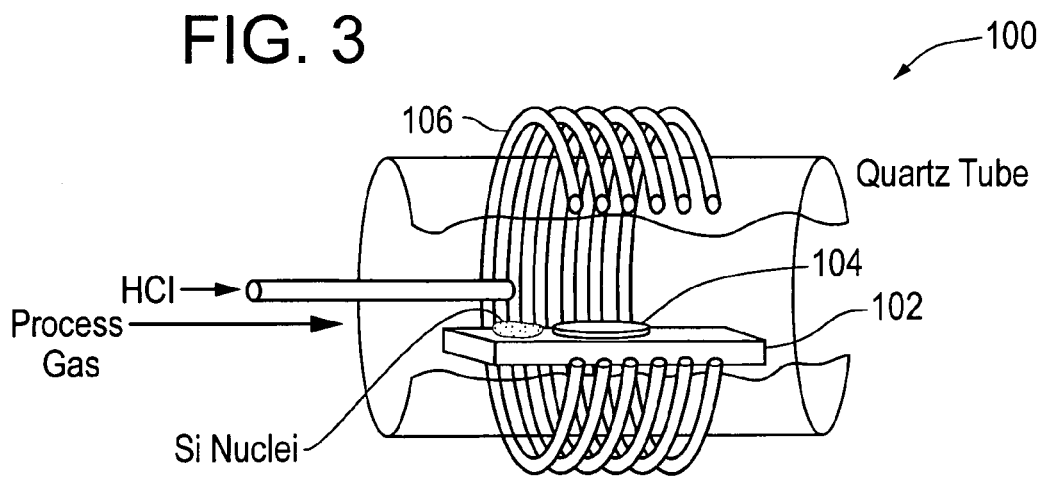
FIG. 3 depicts a chemical vapor deposition method according to a further illustrative embodiment of the invention.

FIGS. 2 and 3 depict illustrative embodiments of inventive methods. FIG. 2 shows a silicon source being added concurrently with hydrocarbons and a chlorine-containing component. FIG. 3 shows the chlorine-containing component being added separately from the silicon source and the hydrocarbons.

Alternatives to group VII-containing components, such as HCl, additions can be used. In an illustrative embodiment of the invention, silane can be fully or partially eliminated and replaced by trichlorosilane or silicon tetrachloride, which are less prone to form clusters in the gas phase. Dichlorosilane is not practical due to the problems with homogeneous nucleation using this precursor. This precursor is avoided in the Si industry for exactly this reason.

It is estimated that the growth rates can be raised by a factor of ten over traditional epitaxy methods when practicing embodiments of the invention. The growth temperature may also be lowered, the hydrogen flow may be reduced, and the pressure may be raised. This may result in a better quality epitaxial layer, a less costly reactor, and a longer lifetime of the graphite parts inside the reactor.

In an exemplary embodiment of the invention, the silicon carbide growth rate is between about 3 µm/h and 50 µm/h. In a particular embodiment, the growth rate is greater than about 5 µm/h, and in a further embodiment the growth rate is greater than about 20 µm/h.

An illustrative growth temperature is less than about 1600° C., and in a further embodiment the growth temperature is less than about 1500°. In yet a further embodiment of the invention, the growth temperature is less than about 1400°. In an exemplary embodiment, the growth temperature is in a range of about 1100° C. to about 1500° C.

The pressure is preferably greater than about 200 mbar and more preferably greater than about 500 mbar.

The hydrogen flow rate is preferably less than about 50 SLM and more preferably less than about 20 SLM.

Additionally, a low thermal conductivity gas, that is preferably inert, may be added to the gas stream if needed to improve the uniformity further. Argon is particularly well suited for this use. Best suited gases will have a thermal conductivity in the range of about 0.1 to 0.01 W/m·K.

Silicon Carbide Epitaxial Growth Experiments

First Experiment: The parameters were: silane flow 20 ml/min, ethylene 12 ml/min, $H_2$ 80 SLM, temperature 1600 C, pressure 200 mbar. The first experiment was performed without HCl. The growth rate was 3 microns/h and the doping was low at $5 \times 10^{14}$ cm$^{-3}$ n-type.

Second Experiment: The same parameters were used as in the first experiment except HCl was added at a flow rate of 20 ml/min. This sample gave a surprisingly higher growth rate of 3.5 µm/h and a higher doping of $2 \times 1015$ cm–3 n-type. The increase in growth rate likely indicates that there is more silicon available for growth. The doping increase is in line with this observation since if there is more silicon available, the effective C/Si ratio is lower for the sample with the HCl addition and therefore it is expected to obtain a higher nitrogen doping.

The invention also includes a semiconductor device having a silicon carbide layer formed by one or more methods described herein. Examples of semiconductor devices that may have a silicon carbide layer are Schottky diodes, FETs, BJTs, IGBTs, GTOs, CMOS devices and MEMs devices.

While the invention has been described by illustrative embodiments, additional advantages and modifications will occur to those skilled in the art. Therefore, the invention in its broader aspects is not limited to specific details shown and described herein. Modifications, for example, to the types of group VII-containing compounds, process parameters and epitaxial growth equipment, may be made without departing from the spirit and scope of the invention. Accordingly, it is intended that the invention not be limited tot he specific illustrative embodiments, but be interpreted within the full spirit and scope of the appended claims and their equivalents.

The invention claimed is:

1. A homo-epitaxial growth method of forming a silicon carbide layer comprising:
dissociating silicon clusters in a gas phase by introducing a dissociation enhancer into a silicon carbide precursor stream in addition to the silicon carbide precursors.

2. The method of claim 1 wherein the silicon clusters are dissociated by a Si-etching gas.

3. The method of claim 1 wherein the silicon clusters are dissociated by interacting a group VII-containing component with a silicon precursor.

4. The method of claim 3 wherein the group VII-containing component is selected from the group consisting of HCl, HBr, HF and a combination of two or more of the aforementioned compounds.

5. The method of claim 3 wherein the group VII-containing component is a chlorine-containing component.

6. The method of claim 5 wherein the chlorine-containing component is HCl.

7. The method of claim 1 wherein the silicon clusters are formed from silicon originating from silane.

8. The method of claim 5 wherein the chlorine-containing component is trichlorosilane or silicon tetrachloride.

9. The method of claim 8 further comprising mixing hydrogen with the trichlorosilane or silicon tetrachloride.

10. The method of claim 9 wherein the hydrogen is mixed with the trichlorosilane or silicon tetrachloride in the hot zone of a growth chamber.

11. The method of claim 8 wherein the chlorine-containing component is silicon tetrachloride.

12. The method of claim 1 wherein the growth temperature is less than about 1500° C.

13. The method of claim 12 wherein the growth temperature is less than about 1400° C.

14. The method of claim 1 wherein the growth temperature is in a range of about 1100° C. to about 1500° C.

15. The method of claim 1 wherein the pressure is greater than about 200 mbar.

16. The method of claim 15 wherein the pressure is greater than about 500 mbar.

17. The method of claim 1 wherein the hydrogen flow rate is less than about 50 SLM.

18. The method of claim 17 wherein the hydrogen flow rate is less than about 20 SLM.

19. The method of claim 8 further comprising including a gas with a thermal conductivity in the range of about 0.1 to 0.01 W/m·K. with the group VII-containing component.

20. The method of claim 19 wherein the gas is inert.

21. The method of claim 20 wherein the gas is argon.

22. The method of claim 3 where the group VII-containing component is introduced separately from the silicon precursor.

23. The method of claim 3 wherein the group VII-containing component is introduced at a distance from the sample on which the silicon carbide is formed in the range of about 10 mm to 1000 mm.

24. The method of claim 1 wherein the silicon carbide growth rate is greater than about 20 μm/h.

25. The method of claim 24 wherein the silicon carbide growth rate is greater than about 40 μm/h.

26. A semiconductor device having a silicon carbide layer formed by the method of claim 1.

27. The semiconductor device of claim 26 wherein the device is selected from the group consisting of Schottky diode, FET, BJT, IGBT, GTO, CMOS, and MEM.

28. The semiconductor device of claim 27 wherein the device is a CMOS device.

29. The semiconductor device of claim 27 wherein the device is a MEMs device.

30. A homo-epitaxial growth method of forming a silicon carbide layer comprising:
dissociating silicon clusters in a gas phase:
introducing one or more chlorosilanes and one or more hydrocarbons in the hot zone of a growth chamber, wherein the hot zone is at a temperature in a range of about 1100° C. to about 1500° C.

31. The method of claim 30 further comprising the hydrocarbons being in a hydrogen carrier gas.

32. The method of claim 30 performed in a growth chamber, wherein at least a portion of the one or more chlorosilanes and at least a portion of the one or more hyrdocarbons are introduced into the growth chamber together.

33. The method of claim 30 performed in a growth chamber, wherein the hydrocarbons are introduced separately from the chlorosilanes, and are mixed with each other at a hot zone of the growth chamber.

34. The method of claim 33 wherein the chlorosilanes are in an inert carrier gas.

35. The method of claim 34 wherein the carrier gas is helium.

36. The method of claim 30 wherein the hot zone spans a distance of about 10 mm to 300 mm perpendicularly from a surface on which the silicon carbide is grown.

37. The method of claim 36 wherein the hot zone spans a distance of about 20 mm to 100 mm perpendicularly from a surface on which the silicon carbide is grown.

38. The method of claim 30 wherein the chlorosilane is selected from the group consisting of trichlorosilane and silicon tetrachloride.

39. The method of claim 30 wherein the growth temperature is less than about 1500° C.

40. The method of claim 39 wherein the growth temperature is less than about 1400° C.

41. A semiconductor device having a silicon carbide layer formed by the method of claim 30.

42. The semiconductor device of claim 41 selected from the group consisting of Schottky diode, FET, BJT, IGBT, GTO, CMOS, and MEM.

43. The semiconductor device of claim 42 wherein the device is a CMOS device.

44. The semiconductor device of claim 42 wherein the device is a MEMs device.

* * * * *